(12) United States Patent
Rapey

(10) Patent No.: US 6,785,138 B1
(45) Date of Patent: Aug. 31, 2004

(54) REPEATER CASE FOR HDSL MODULES

(75) Inventor: Kenneth T. Rapey, Fayetteville, GA (US)

(73) Assignee: Added Communications of Georgia, Inc., Suwanee, GA (US)

(*) Notice: Subject to any disclaimer, the term of this patent is extended or adjusted under 35 U.S.C. 154(b) by 0 days.

(21) Appl. No.: 10/235,133

(22) Filed: Sep. 5, 2002

(51) Int. Cl.[7] .................................................. H05K 7/20
(52) U.S. Cl. .................... 361/704; 361/690; 361/719; 361/721; 455/128
(58) Field of Search ............................. 361/704, 707, 361/716, 719, 721, 729; 174/16.1, 50.51, 50.52, 50.54; 165/80.3, 185

(56) References Cited

U.S. PATENT DOCUMENTS

| | | | |
|---|---|---|---|
| 3,991,288 A | 11/1976 | George et al. ............... 179/179 |
| 4,315,300 A | 2/1982 | Parmerlee et al. ........... 361/382 |
| 4,447,856 A | 5/1984 | Takahashi et al. .......... 361/383 |
| 4,514,746 A | 4/1985 | Lundqvist .................... 361/385 |
| 4,549,602 A | 10/1985 | Espinoza ................... 165/80.2 |
| 4,731,698 A | 3/1988 | Milot et al. .................... 361/386 |
| 4,763,224 A | 8/1988 | Bentz et al. ................ 361/386 |
| 4,935,845 A | 6/1990 | Schwehr et al. ............ 361/384 |
| 5,121,290 A | 6/1992 | Azar .......................... 361/384 |
| 5,267,122 A | 11/1993 | Glover et al. ................ 361/704 |
| 5,398,161 A | 3/1995 | Roy ............................. 361/727 |
| 5,450,272 A | 9/1995 | Van Gaal et al. ............ 361/690 |
| 5,539,620 A | 7/1996 | Gale et al. ................... 361/800 |
| 5,566,055 A | 10/1996 | Salvi, Jr. ..................... 361/816 |
| 5,786,548 A * | 7/1998 | Fanucchi et al. .......... 174/50.54 |
| 5,812,373 A | 9/1998 | Hwang ........................ 361/704 |
| 5,812,374 A | 9/1998 | Shuff .......................... 361/704 |
| 5,896,268 A * | 4/1999 | Beavers ...................... 361/690 |
| 5,896,272 A | 4/1999 | Hendrix et al. ............. 361/704 |
| 5,896,286 A | 4/1999 | Terasawa .................... 361/690 |
| 5,912,805 A * | 6/1999 | Freuler et al. .............. 361/705 |
| 5,930,113 A | 7/1999 | McCann ..................... 361/704 |
| 6,067,229 A | 5/2000 | Johnson et al. ............. 361/704 |
| 6,118,662 A | 9/2000 | Hutchison et al. .......... 361/704 |
| 6,157,539 A | 12/2000 | Wagner et al. .............. 361/704 |
| 6,201,700 B1 | 3/2001 | Tzinares et al. ............. 361/719 |
| 6,278,608 B1 | 8/2001 | Ater et al. ................... 361/695 |
| 6,297,958 B1 | 10/2001 | Lutz, Jr. ...................... 361/690 |
| 6,396,691 B1 * | 5/2002 | Pagnozzi .................... 361/690 |
| 6,411,513 B1 * | 6/2002 | Bedard ....................... 361/704 |
| 6,587,339 B1 * | 7/2003 | Daniels et al. .............. 361/690 |

* cited by examiner

*Primary Examiner*—Boris Chervinsky
(74) *Attorney, Agent, or Firm*—MacCord Mason PLLC

(57) ABSTRACT

A repeater case for high density subscriber lines includes a repeater base and a repeater housing forming a sealed enclosure and having interior walls. A plurality of module slots receive HDSL-4 circuit board modules. A heat conductive material in the housing contacts HDSL-4 modules in the slots and the housing to form a heat escape path to ambient. The HDSL-4 modules are cooled through thermal conductivity with thermally conductive contact with the interior wall of the repeater housing. The heat conductive material is not required for structural support of the modules or their electrical functioning.

23 Claims, 4 Drawing Sheets

US 6,785,138 B1

REPEATER CASE FOR HDSL MODULES

BACKGROUND OF THE INVENTION

The present invention relates to improvements in repeater cases and design thereof for high density subscriber lines. Repeater cases have been known for years and the technology was well developed for T1 telecommunication lines. The cases are designed to hold sensitive telecommunications equipment in relatively unfavorable environments. In particularly, they are designed for installation in manholes or on telephone poles exposed to the weather. Accordingly, in order to protect the contents, the housing of the cases provide environmental protection and seal the contents from the impact of the environmental elements such as water, insects, and the like.

The repeater cases, which were originally designed to hold T1 line cards, have been used to hold HDSL modules. The HDSL modules work well in the T1 repeater case, except that it has been found that the modules prematurely fail due to excessive heat build up in the case. Premature failure adds considerably to the cost in having to replace the modules. The modules are fairly expensive in the first instance and replacement, of course, creates additional expense. There is also a problem of loss of reliability and performance arising from the premature failure. Obviously, when a module fails, it needs to be replaced and there is a cessation of service. If there are several module failures, the maintenance costs will also rise in addition to the cost of the module itself. There is a need in the art for a solution to the heat build-up problem in the HDSL cases.

In addition to the heat causing the electronics to fail, applicant has found another failure mode arising from high heats in the repeater case. The material of the connectors to which the cards are mounted fatigue, causing dimensional instability, warping and cracking. This, in turn can cause a loss of connection between the module and the connector, leading to performance failures.

SUMMARY OF THE INVENTION

The present invention fulfills one or more of these needs in the art by providing a repealer case for high density subscriber lines including a repeater base, a repeater housing having interior walls forming a sealed enclosure with the base, a plurality of module slots wherein the module slots are configured to receive HDSL-4 circuit board modules and wherein the HDSL-4 circuit board modules are cooled through thermal conductivity with thermally conductive contact with certain of the interior walls of the repeater housing. The thermally conductive material is not being required for structural support of the modules or their electrical functioning.

The apparatus may further include a cable inlet in the repeater case which has the capability to receive high density subscriber lines. The sections of the repeater case are made from a high temperature plastic. The repealer housing has a lid with an interior wall and typically includes a layer of thermally conductive material attached to the interior wall of the repeater housing lid. This layer of thermally conductive material preferably includes an exterior layer of aluminum foil on the top and bottom of the layer of thermally conductive material. A preferred thermal conductive material is G974 Therm-A-Gap material.

The repeater base of the repeater case can have up to twenty-five module slots to receive the HDSL-4 circuit board modules. The HDSL-4 circuit board modules further include connectors which are mounted to a circuit boards. These connectors are preferably made of a high temperature plastic, and the circuit board is preferably made of phenolic. The connectors, which receive the HDSL-4 circuit board modules are electrically connected to the cable inlet in the repeater housing case in conventional fashion through the phenolic board. The repeater case is typically comprised of three different sections, the repeater case, the repeater housing, and the repeater base.

After the HDSL-4 circuit board modules are mounted in the module slots and the connectors are connected to the high density subscriber lines via the cable inlet, the sections of the repeater case may be closed. A rubber gasket is placed between the repeater base and the repeater housing, and the repeater housing is bolted to the repeater base. Then, a rubber gasket is placed between the repeater case and the repeater housing lid, and the repeater housing lid is bolted to the repeater housing. When the repeater housing parts are connected, the repeater case is sealed and protects the HDSL-4 circuit board modules within from the environment. The interior of the housing may be pressurized in conventional fashion.

When the repeater housing lid is put in place, the thermally conductive material and the aluminum foil layer comes into contact with the tops of the HDSL-4 circuit board modules. When the lid is closed and tightened, the thermally conductive material compresses sufficiently against the HDSL-4 circuit board modules to make a good thermal transfer contact. The layer of thermally conductive material receives the heat generated by the HDSL-4 circuit board modules, and the heat is then distributed through the thermally conductive material layer. From there, the heat is radiated through the repeater housing lid to the outside, thereby keeping the heat build-up within the repeater case to a level which permits the HDSL-4 circuit board modules to operate and function without failure.

Preferably, the modules are mounted in high temperature connectors. The connectors are made of a plastic that can withstand the temperatures expected in the housing without fatiguing or deforming, and are, in turn, mounted to a phenolic circuit board.

The invention also provides a method of converting a repeater case so as to dissipate thermal energy from high-density subscriber lines including providing repeater case including a base, housing and lid; and installing a thermally conductive material in the lid sized so as to come into contact with the tops of HDSL modules mounted in the repeater case when the lid is mounted on the case. The method may include installing connectors for the HDSL modules in the case that are made of a plastic selected to withstand the expected operating conditions of the repeater case without warping.

DESCRIPTION OF THE PREFERRED EMBODIMENTS

Figure 1:
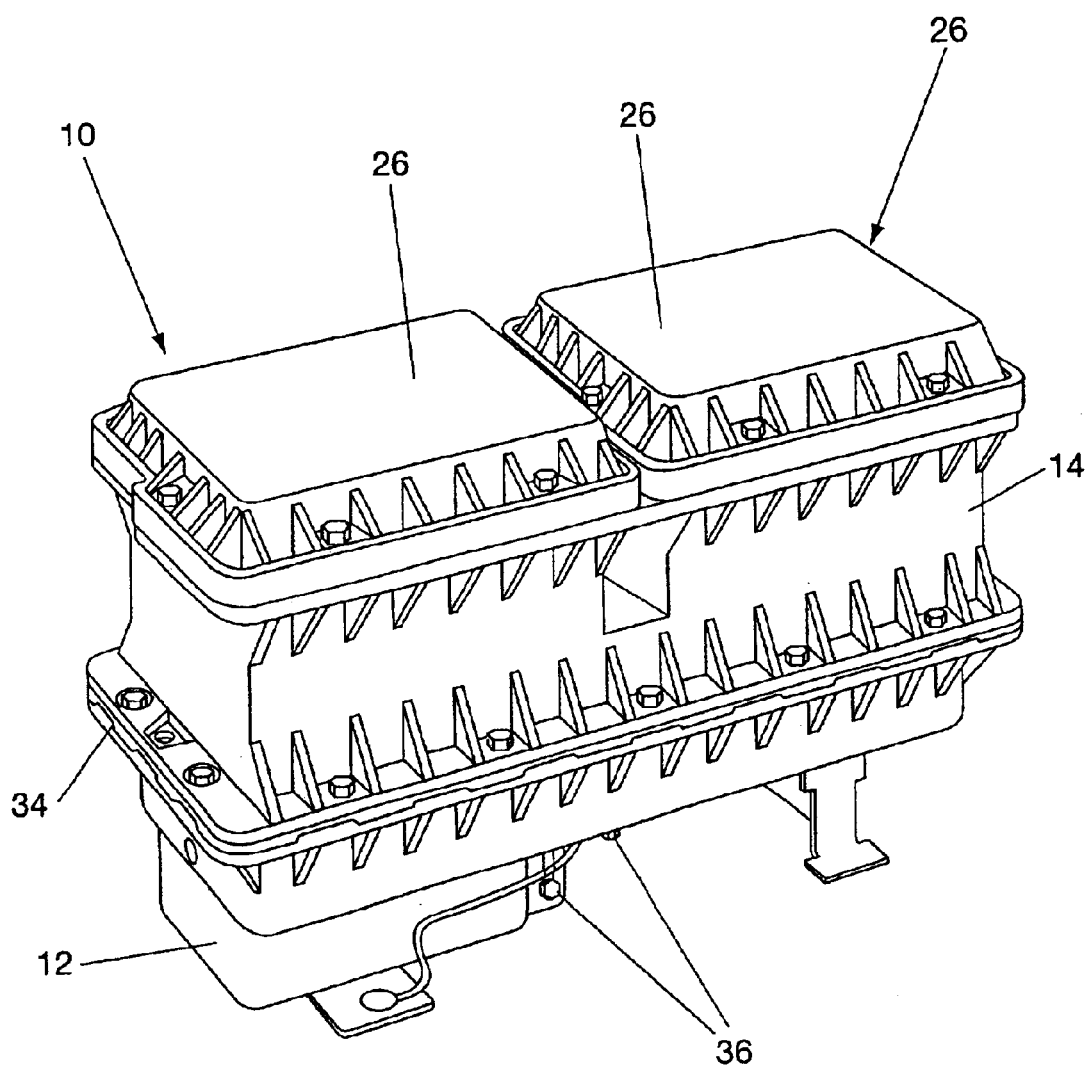
FIG. 1 is a front perspective view of a repeater case according to a preferred embodiment of the invention.

In the following description like reference characters designate like or corresponding parts throughout the several views. Also, in the following description it is to be understood that such terms as "forward", "rearward", "left", "right", "upwardly", "downwardly" and the like are words of convenience and are not to be construed as limiting terms. Referring now to the drawings in general, and FIG. 1 in particular it will be understood that the illustrations are for the purpose of describing a preferred embodiment of the invention and are not intended to limit the invention thereto.

As best seen in FIG. 1, the repeater case 10 includes a repeater base 12, a repeater case housing 14, and a repeater housing lid 26. In the embodiment shown in FIG. 1, the lid 26 is in two sections. When closed as shown in FIG. 1, the repeater case housing 14 is secured closed with bolts 36 to the repeater base 12. A gasket 34 placed between the repeater case housing 14 and the repeater base 12 before it is bolted closed provides a sealed container. The repeater housing lid 26 is bolted with bolts 36 to the repeater case housing 14. A gasket 34 is placed between the repeater housing lid 26 and the repeater case housing 14 before it is bolted. Once all of the parts of the repeater case 10 are bolted together, the entire unit provides a sealed enclosure.

The repeater case 10 further includes a cable inlet 22 (see FIG. 3), which receives a stub for high density subscriber lines. The repeater base 12, the repeater case housing 14, and the repeater housing lid 26 which comprise the exterior parts of the repeater case 10 are constructed of a conventional repeater case material such as high temperature plastic. This high temperature plastic assists with radiating the heat from within the repeater case 10 including through the repeater housing lid 26 to the outside of the housing.

Figure 2:
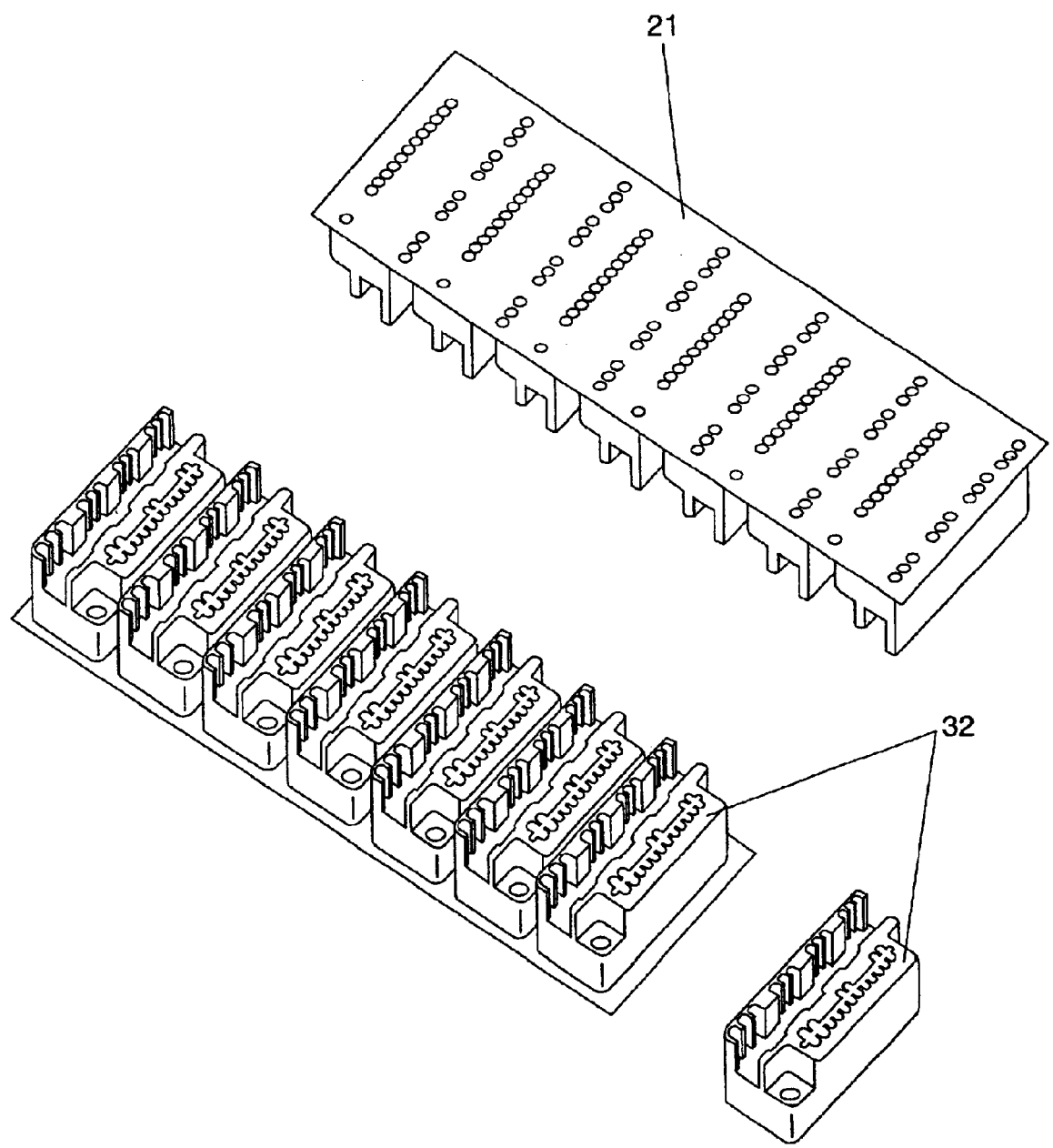
FIG. 2 is a perspective view of the circuit board connectors according to the preferred embodiment of the invention.
Figure 3:
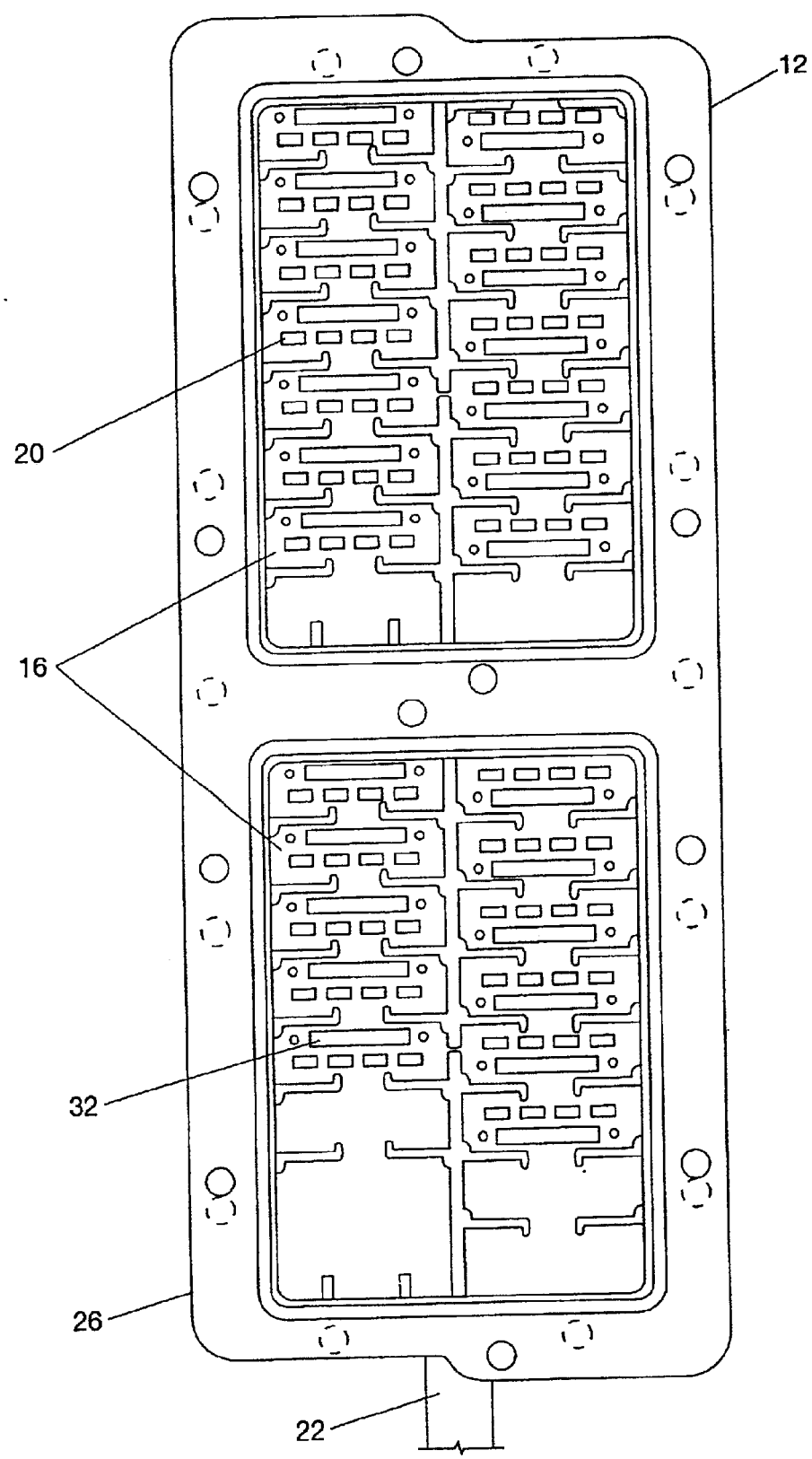
FIG. 3 is a top schematic drawing of the inside of the repeater case looking downward, showing the module slots with HDSL-4 circuit boards according to the preferred embodiment of the invention.

FIG. 3 shows that the repeater case 10 has a plurality of module slots 16 which have been configured to receive HDSL-4 circuit board modules 20. The repeater base 12 is designed to have up to 25 module slots 16. These features are conventional. The module slots 16 provide space to hold the HDSL-4 circuit board modules 20. A phenolic circuit board 21, seen in FIG. 2 has connections to the cable inlet 22 and has mounted on it connectors 32. The connectors 32 are shown in FIG. 2 and made of a high temperature plastic. The preferred plastic of the connectors 32 is ABS D-150, which does not prematurely fatigue at the expected operating temperatures and maintains its dimensional stability at the elevated operating temperatures. This improvement prevents loosening of connections to the HDSL-4 modules.

Figure 4:
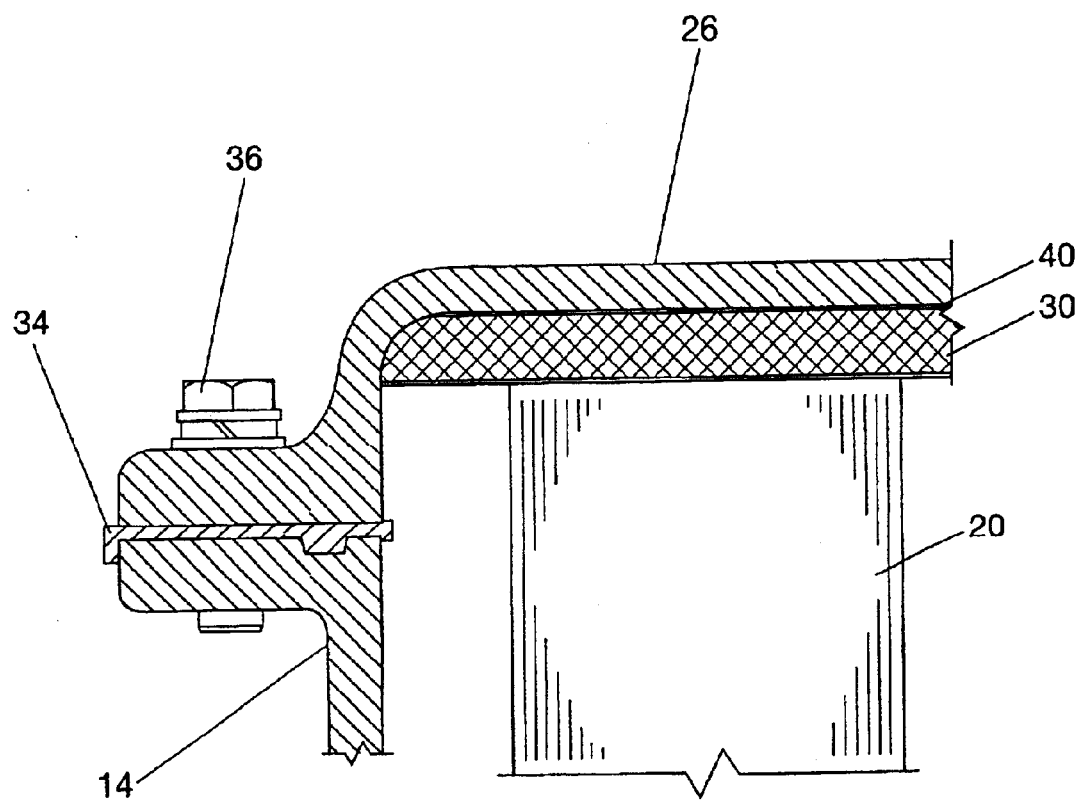
FIG. 4 is a partial sectional view of the repeater housing lid and housing showing placement of the thermally conductive material and HDSL-4 circuit modules within the repeater case according to the preferred embodiment of the invention.

Referring now to FIG. 4, the repeater case housing 14 and the repeater housing lid 26 are depicted. FIG. 4 depicts a cross-sectional view of the repeater housing lid 26 and the repeater case housing 14 sealed with a gasket 34 and a bolt 36. The repeater housing lid 26 has nested within it a layer of thermally conductive material 30. If desired, an adhesive material may be used to secure the material 30 to the lid. In the preferred embodiment, this layer of thermally conductive material 30 is G974 Therm-A-Gap material available from Chromerics, a Division of Parker Hannifin Corp., 77 Dragon Court, Woburn Mass. 01888-4014. Therm-A-Gap is described as an electrically non-conductive, boron-nitride-filled silicone elastomer best suited for applications with pressures from 5 to 100 psi. A thermally conductive foil such as aluminum foil 40 is layered on both sides of the thermally conductive material 30. In the sealed position shown in FIG. 4, the repeater housing lid 26 with the thermally conductive material 30 is in slight compression with the HDSL-4 circuit board modules 20.

In operation, the heat generated by the HDSL-4 circuit board modules 20 conducts to the thermally conductive material 30. The thermally conductive material 30 in the repeater housing lid 26 distributes the heat throughout the layer of thermally conductive material 30 and the repeater housing lid 26 with which it is in intimate contact. The heat is thereafter radiated through the repeater housing lid 26 to the outside.

A laboratory test was conducted to determine the effectiveness of the repeater case 10 with the thermally conductive material 30 in the repeater housing lid 26 as compared to a repeater housing lid 26 containing just high temperature plastic. The repeater case 10 was loaded with twenty-five HDSL-4 circuit board modules 20 in the module slots 16. A 30 watt cartridge heater at 120 volts was used for the heat source for each of the twenty-five modules. A 30 watt cartridge heater created a heat effect of 5.25 watts per module. Both units were placed under electrical load for four hours. The temperature readings of the modules were recorded after four hours of the electrical load. In addition, a solar load was applied to determine the effect of a sun bake with equal amounts at 100% on the left side of the top and right side of the repeater case 10. The solar load provided a simulation of an ambient temperature of 145° F. Sensors were placed at various locations in the repeater case 10 with the plain top, and sensors were placed in the same locations in the repeater case 10 of the lid with the thermally conductive material 30. Sensor numbers 1L and 2L were placed at the top and bottom of the repeater housing lid 26. Sensors 1T, 2T, and 3T were placed on the HDSL-4 circuit board modules 20. Sensor 5 was placed on the side of the HDSL-4 circuit board module 20 near a connector.

| Sensor Location | Plain | Lid with Thermally Conductive Material |
| --- | --- | --- |
| 1L | 163.4° F. | 156.6° F. |
| 2L | 162.3° F. | 152.6° F. |
| 1T | 179.8° F. | 168.3° F. |
| 2T | 182.4° F. | 169.9° F. |
| 3T | 170.6° F. | 166.8° F. |
| 5S | 178.3° F. | 170.1° F. |

The test indicates that the repeater housing lids 26 with the thermally conductive material 30 maintained lower temperatures at the test sites in the cases. The sensor locations of the repeater case 10 with the thermally conductive material 30 in the repeater housing lid 26 averaged 8.5 degrees less than the repeater case 10 with the plain repeater housing lid 26.

The thermally conductive material 30 assists in an efficient removal of heat from within a sealed atmosphere of the repeater case 10. Excessive heat build up can produce a failure of the HDSL-4 circuit board modules 20 and failure of the connectors 32. Excessive heat causes the connectors 32 from to disconnect from the HDSL-4 circuit board modules 20, thereby causing failure of these modules. Making the connectors 32 of high temperature plastic assists in maintaining the electrical connection between the connectors 32 and the HDSL-4 circuit board modules 20. The thermally conductive material 30 in the repeater housing 26 creates an efficient removal of heat buildup within the sealed atmosphere of the repeater case 10, reducing heat buildup problems and HDSL-4 circuit board module 20 failure.

Certain modifications and improvements will occur to those skilled in the art upon reading of a foregoing description. It should be understood that all such modifications have been deleted herein for the sake of conciseness and readability but are properly within the scope of the following claims.

What is claimed is:

1. A repeater case for high density subscriber lines comprising:
a repeater base;
a repeater housing forming a sealed enclosure with the base and having interior walls;
a plurality of module slots configured to receive HDSL-4 circuit board modules;
a heat conductive material in the housing sized and positioned to contact both the HDSL-4 circuit board modules and the housing to form a heat escape path from the modules to ambient, the heat conductive material attached to an interior wall of a lid of the repeater housing, the heat conductive material not being required for structural support of the modules or their electrical functioning,
wherein the HDSL-4 circuit board modules are cooled through thermal conductivity with thermally conductive contact with the interior wall of the repeater housing to the ambient outside of the repeater case.

2. The apparatus according to claim 1, wherein the repeater case further includes a cable inlet.

3. The apparatus according to claim 2, wherein the cable inlet receives the high density subscriber lines.

4. The apparatus according to claim 1, wherein the repeater housing is made of a high temperature plastic.

5. The apparatus according to claim 4, wherein the layer of thermally conductive material further includes an exterior layer of metallic foil on the top and bottom of the thermally conductive material.

6. The apparatus according to claim 1, wherein the repeater base contains not more than 25 module slots with HDSL-4 circuit board modules.

7. The apparatus according to claim 1, further comprising circuit board cards for connectors to the HDSL-4 circuit boards modules made of phenolic material.

8. The apparatus according to claim 7, wherein the circuit board cards further include connectors for mounting the HDSL-4 circuit boards modules.

9. The apparatus according to claim 8, wherein the connectors are made of a high temperature plastic.

10. The apparatus according to claim 8, wherein the connectors are electrically connect the high density subscriber lines to the cable inlet.

11. The apparatus according to claim 1, wherein the repeater base and repeater housing are sealably connectable.

12. The apparatus according to claim 11, wherein the sealable connection of the repeater base and repeater housing further includes a rubber gasket between the repeater base and the repeater housing.

13. The apparatus according to claim 12, wherein the repeater housing and the repeater base are bolted together after the rubber gasket is put in place.

14. The apparatus according to claim 11, wherein the thermally conductive material in the repeater housing lid is sized to come in contact with the HDSL-4 circuit boards modules when the repeater base and the repeater housing are closed.

15. The apparatus according to claim 14, wherein the thermally conductive material within the housing lid is in compression with the HDSL-4 circuit modules.

16. The apparatus according to claim 13, wherein the thermally conductive material receives the heat generated by the HDSL-4 circuit board modules.

17. The apparatus according to claim 16, wherein the heat is distributed through the thermally conductive material in the repeater housing lid.

18. The apparatus according to claim 16, wherein the heat is radiated through the repeater housing lid to the outside of the housing.

19. A repeater case for high density subscriber lines comprising:
a repeater base;
a repeater housing made of a high temperature plastic forming a sealed enclosure with the base and having interior walls and including a lid, the repeater base, repeater housing and lid being sealably connectable;
a plurality of module slots in the housing configured to receive HDSL-4 circuit board modules;
a cable inlet to the repeater base to receive the high density subscriber lines;
a circuit board card made of phenolic material and connected to the cable inlet;
connectors on the circuit board made of a high temperature plastic for mounting the HDSL-4 circuit boards modules;
a heat conductive material
having an exterior layer of metallic foil on the top and bottom of the thermally conductive material,
being attached to an interior wall of the lid of the repeater housing, and
sized to come in contact with the HDSL-4 circuit boards modules and become compressed when the repeater base and the repeater housing are closed, thereby thermally interconnecting the HDSL-4 circuit board modules and the lid to form a heat escape path from the modules to ambient through the heat conductive material.

20. A method of dissipating thermal energy from high-density subscriber lines comprising:
opening a repeater case;
installing HDSL-4 circuit board modules within the plurality of module slots within the base of the repeater case and mounting the HDSL-4 circuit board modules to connectors, thereby creating electrical connectivity with the high density subscriber lines through the cable inlet of the base of the repeater case;
closing and sealing the repeater housing with a lid having a layer of thermally conductive material, thereby creating compressive contact between the HDSL-4 circuit board modules and the thermally conductive material;
operating the high density subscriber lines thereby generating heat within the repeater case; and
conducting heat from the HDSL-4 circuit board modules through the thermally conductive layer of the repeater housing lid to the outside environment.

21. The method of claim 20 wherein installing includes installing up to twenty-five HDSL-4 circuit board modules within the module slots within the base of the repeater case.

22. A method of converting a repeater case so as to dissipate thermal energy from high-density subscriber lines comprising:
providing a repeater case including a base, a housing HDSL modules in the base and a lid; and
installing a thermally conductive material in the lid sized so as to come into contact with the tops of the HDSL modules mounted in the repeater case when the lid is mounted on the case.

23. A method as claimed in claim 22, further comprising installing connectors for the HDSL modules in the case that are made of a plastic selected to withstand the expected operating conditions of the repeater case without warping.

* * * * *